(12) United States Patent
Ding et al.

(10) Patent No.: US 10,585,304 B2
(45) Date of Patent: Mar. 10, 2020

(54) ARRAY SUBSTRATE AND METHOD FOR FABRICATING THE SAME, DISPLAY APPARATUS

(71) Applicant: BOE TECHNOLOGY GROUP CO., LTD., Beijing (CN)

(72) Inventors: Xiaoliang Ding, Beijing (CN); Xue Dong, Beijing (CN); Jing Lv, Beijing (CN); Haisheng Wang, Beijing (CN); Chunwei Wu, Beijing (CN); Yingming Liu, Beijing (CN); Wei Liu, Beijing (CN); Rui Xu, Beijing (CN); Pengpeng Wang, Beijing (CN); Yanling Han, Beijing (CN); Xueyou Cao, Beijing (CN); Ping Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/936,830

(22) Filed: Mar. 27, 2018

(65) Prior Publication Data
US 2018/0217430 A1 Aug. 2, 2018

Related U.S. Application Data

(63) Continuation of application No. PCT/CN2017/089526, filed on Jun. 22, 2017.

(30) Foreign Application Priority Data

Jun. 30, 2016 (CN) .......................... 2016 1 0513571

(51) Int. Cl.
*G06F 3/042* (2006.01)
*G02F 1/1333* (2006.01)
(Continued)

(52) U.S. Cl.
CPC ........ *G02F 1/13338* (2013.01); *G02F 1/1368* (2013.01); *G02F 1/136209* (2013.01); *G02F 1/136286* (2013.01); *G06F 3/042* (2013.01); *G06F 3/0412* (2013.01); *G06F 3/0421* (2013.01); *G06K 9/0004* (2013.01); *G06K 9/2018* (2013.01); *H01L 27/124* (2013.01);
(Continued)

(58) Field of Classification Search
None
See application file for complete search history.

(56) References Cited

U.S. PATENT DOCUMENTS

2008/0121442 A1* 5/2008 Boer ...................... G06F 3/0412
                                                              178/18.09
2015/0145840 A1* 5/2015 Lim ..................... H01L 27/1446
                                                              345/207

* cited by examiner

*Primary Examiner* — Joseph R Haley
(74) *Attorney, Agent, or Firm* — Nath, Goldberg & Meyer; Joshua B. Goldberg; Stephanie Majkut (57) ABSTRACT

The present disclosure provides an array substrate and a method for fabricating the same, and a display apparatus. The array substrate includes: a base substrate, and a shielding pattern and a plurality of detection units on the base substrate. At least one of the plurality of detection units includes a switch transistor and a photosensitive device coupled to the switch transistor. The shielding pattern covers the switch transistor on a side of the switch transistor distal to the base substrate. The photosensitive device is located on a side of the shielding pattern proximal to the base substrate. The shielding pattern is configured to shield irradiation light and allow detection light to be transmitted to the photosensitive device.

18 Claims, 8 Drawing Sheets

(51) Int. Cl.
    *G06F 3/041*         (2006.01)
    *G06K 9/20*          (2006.01)
    *H01L 29/786*      (2006.01)
    *H01L 27/12*        (2006.01)
    *G02F 1/1362*      (2006.01)
    *G02F 1/1368*      (2006.01)
    *G06K 9/00*         (2006.01)
    *H01L 27/144*      (2006.01)
    *H01L 31/167*      (2006.01)
    G02F 1/133        (2006.01)
    G02F 1/1335       (2006.01)
    G02F 1/13357      (2006.01)
    H01L 31/105       (2006.01)

(52) U.S. Cl.
    CPC ...... *H01L 27/1214* (2013.01); *H01L 27/1262* (2013.01); *H01L 27/1443* (2013.01); *H01L 27/1446* (2013.01); *H01L 29/78633* (2013.01); *H01L 31/167* (2013.01); *G02F 1/1336* (2013.01); *G02F 1/133514* (2013.01); *G02F 2001/13312* (2013.01); *G02F 2001/136222* (2013.01); *G02F 2001/136295* (2013.01); *G02F 2201/58* (2013.01); *G02F 2202/105* (2013.01); *G02F 2203/11* (2013.01); *G06F 2203/04103* (2013.01); *G06F 2203/04109* (2013.01); *H01L 31/105* (2013.01)

ARRAY SUBSTRATE AND METHOD FOR FABRICATING THE SAME, DISPLAY APPARATUS

CROSS-REFERENCE TO RELATED APPLICATION

This is a National Phase Application filed under 35 U.S.C. 371 as a national stage of PCT/CN2017/089526, filed on Jun. 22, 2017, an application claiming the benefit of priority to China Patent Application No. 201610513571.4 filed on Jun. 30, 2016, the contents of which are incorporated herein in their entirety by reference.

TECHNICAL FIELD

The present disclosure relates to the field of display technology, and particularly relates to an array substrate and a method for fabricating the same, and a display apparatus.

BACKGROUND

In recent years, with the rapid development of technology, mobile products with biometrics have gradually entered people's life and work. Fingerprint recognition technology receives significant attention due to its capability in identifying people's identity. Area type and swipe type fingerprint recognition technologies based on silicon-based process have been integrated into mobile products, and fingerprint recognition technology in the field of display will be the focus of people's future attention.

SUMMARY

The present disclosure provides a display substrate, including: a base substrate, and a shielding pattern and a plurality of detection units on the base substrate, at least one of the plurality of detection units includes a switch transistor and a photosensitive device coupled to the switch transistor, the shielding pattern covers the switch transistor on a side of the switch transistor distal to the base substrate, the photosensitive device is located on a side of the shielding pattern proximal to the base substrate, and the shielding pattern is configured to shield irradiation light and allow detection light to be transmitted to the photosensitive device.

Optionally, the shielding pattern is configured to allow invisible light to be transmitted to the photosensitive device.

Optionally, the shielding pattern is configured to allow infrared light to be transmitted to the photosensitive device.

Optionally, the array substrate further includes a first electrode layer provided on a side of the switch transistor and the photosensitive device distal to the base substrate and coupled to photosensitive device.

Optionally, the switch transistor is a thin film transistor having a drain electrode coupled to the photosensitive device.

Optionally, the photosensitive device includes a first area and a second area, the drain electrode covers the first area of the photosensitive device on a side of the photosensitive device proximal to the base substrate, and the second area of the photosensitive device is configured to allow the detection light to pass therethrough.

Optionally, the photosensitive device is a photosensitive diode.

Optionally, a connection pattern is provided on a side of the photosensitive device distal to the base substrate, and the connection pattern is on a side of the shielding pattern proximal to the base substrate and coupled to the first electrode layer.

Optionally, the photosensitive diode has a first electrode coupled to the drain electrode of the thin film transistor, and a second electrode coupled to the connection pattern.

Optionally, the first electrode layer is a common electrode layer coupled to a common electrode line.

Optionally, the shielding pattern is a black matrix pattern.

Optionally, a plurality of gate lines and a plurality of signal output lines are formed on the base substrate and define the plurality of detection units.

Optionally, the irradiation light is visible light.

The present disclosure further provides a display apparatus, including a backlight source and any one of the above array substrates, and the backlight source is on a base substrate side of the array substrate and configured to emit the irradiation light and the detection light.

Optionally, the backlight source includes irradiation light sources and detection light sources provided alternately, the irradiation light sources are configured to emit the irradiation light, and the detection light sources are configured to emit the detection light.

The present disclosure further provides a display apparatus, including a backlight source, and a counter substrate and a display substrate opposite to each other, wherein the backlight source is on a side of the display substrate distal to the counter substrate and configured to emit irradiation light and detection light; the display substrate includes a first base substrate and a plurality of detection units on the first base substrate, each of the plurality of detection units includes a switch transistor and a photosensitive device coupled to the switch transistor; the counter substrate includes a second base substrate and a shielding pattern provided on a side of the second base substrate proximal to the display substrate, and the shielding pattern completely covers the switch transistor and is configured to shield the irradiation light and allow the detection light to be transmitted to the photosensitive device.

Optionally, the backlight source includes irradiation light sources and detection light sources provided alternately, the irradiation light sources are configured to emit the irradiation light, and the detection light sources are configured to emit the detection light.

Optionally, the detection light is invisible light.

Optionally, the switch transistor is a thin film transistor having a drain electrode covering the photosensitive device on a side of the photosensitive device proximal to the first base substrate to be coupled to the photosensitive device.

The present disclosure further provides a method for fabricating a display substrate, including: forming a shielding pattern and a plurality of detection units on a base substrate, wherein each of the plurality of detection units is formed to include a switch transistor and a photosensitive device coupled to the switch transistor, the shielding pattern is formed to cover the switch transistor on a side of the switch transistor distal to the base substrate, the photosensitive device is formed on a side of the shielding pattern proximal to the base substrate, and the shielding pattern is formed to shield irradiation light and allow detection light to be transmitted to the photosensitive device.

DETAILED DESCRIPTION

To make those skilled in the art better understand the technical solutions of the present disclosure, an array substrate and a method for fabricating the same, and a display apparatus provided in embodiments of the present disclosure will be further described in detail below in conjunction with the accompanying drawings.

In a display apparatus for implementing fingerprint detection, white light emitted from a backlight source is irradiated onto a finger and then reflected by the finger, the reflected light reaches a photosensitive diode in the display apparatus, and the photosensitive diode converts the reflected light into a current signal, thereby detecting a fingerprint by using the current signal.

Generally, an opening structure is provided at a position, corresponding to the photosensitive diode, of a black matrix pattern in the display apparatus, so that white light reflected by a finger can be irradiated onto the photosensitive diode through the opening structure. In order to ensure that the white light reflected by the finger can be irradiated onto the photosensitive diode, the opening structure needs to have a large size. In this case, light may be irradiated onto a drain electrode of a thin film transistor below the photosensitive diode. Because the drain electrode made of a metal material reflects light, reflective phenomenon occurs in the display apparatus.

Embodiments of the present disclosure provide an array substrate and a method for fabricating the same, and a display apparatus, which can obviate one or more of the problems due to the limitations existing in the related art.

Figure 1:
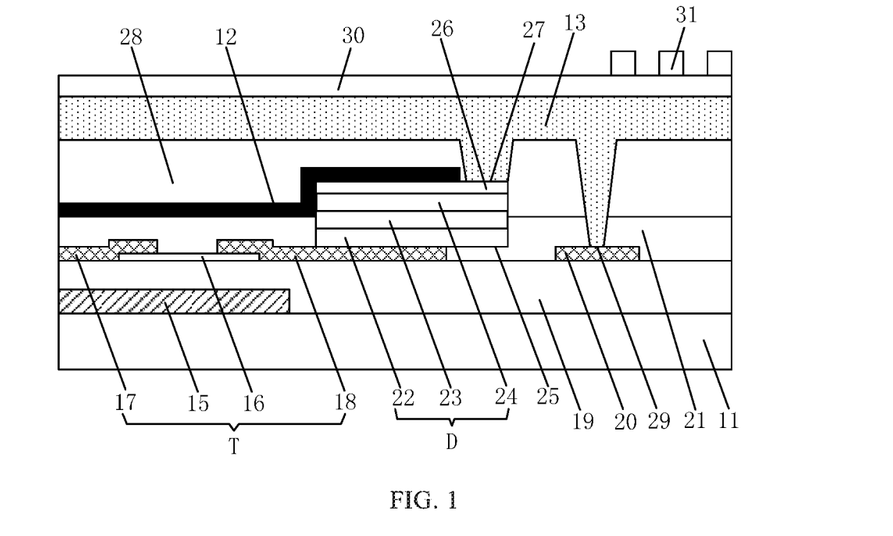
FIG. 1 is a schematic structure diagram of an array substrate provided in an embodiment of the present disclosure.
Figure 2:
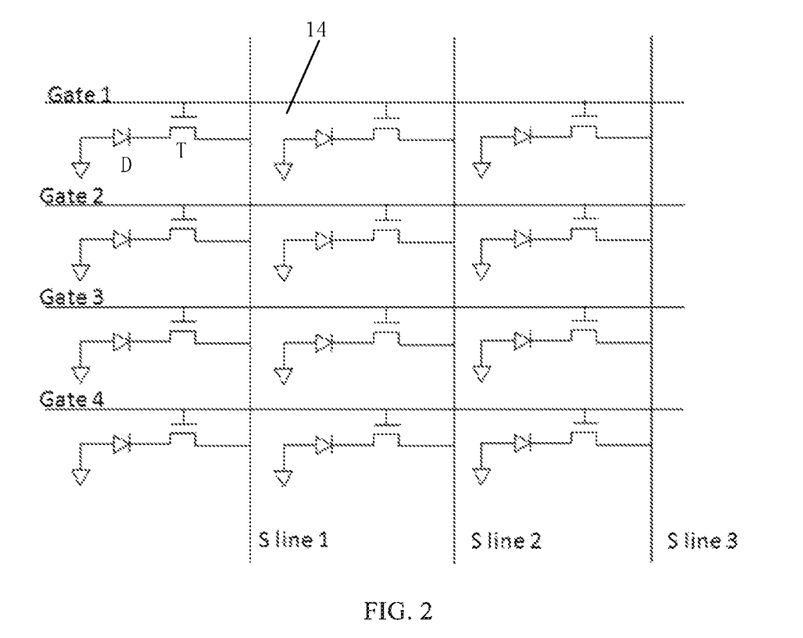
FIG. 2 is an equivalent circuit diagram of the array substrate in FIG. 1.

FIG. 1 is a schematic structure diagram of an array substrate provided in an embodiment of the present disclosure, and FIG. 2 is an equivalent circuit diagram of the array substrate in FIG. 1. As shown in FIGS. 1 and 2, the array substrate according to the embodiment of the present disclosure includes: a first base substrate 11, and a shielding pattern 12 and a plurality of detection units 14 on the first base substrate 11. At least one of the plurality of detection units 14 includes a switch transistor (e.g., a thin film transistor T in FIG. 1) and a photosensitive device (e.g., a photosensitive diode D in FIG. 1) coupled to the switch transistor. The shielding pattern 12 covers the switch transistor on a side of the switch transistor distal to the first base substrate 11 (i.e., a projection of the switch transistor on the first base substrate 11 is within a projection of the shielding pattern 12 on the first base substrate 11). The photosensitive device is on a side of the shielding pattern 12 proximal to the first base substrate 11, and the shielding pattern 12 is configured to shield irradiation light and allow detection light to be transmitted to the photosensitive device.

It should be noted that FIG. 2 illustrates a case where each of the plurality of detection units 14 has a same structure, (i.e., the structure including the switch transistor and the photosensitive device as described above with reference to FIGS. 1 and 2), but the present disclosure is not limited thereto. For example, the structure including the switch transistor and the photosensitive device may be provided in only a part of the plurality of detection units 1. In this case, the reflective phenomenon can also be alleviated. As an example, the structure including the switch transistor and the photosensitive device may be provided in only one of adjacent two detection units.

In the embodiment, the shielding pattern may be made of a metal material such as molybdenum (Mo), copper (Cu), aluminum (Al), or the like.

In the embodiment, the array substrate further includes a first electrode layer 13, which is on a side of the switch transistor, the photosensitive device and the shielding pattern distal to the first base substrate 11, and coupled to the photosensitive device.

In the embodiment, a plurality of gate lines, a plurality of data lines and a plurality of signal output lines are formed on the first base substrate 11. As shown in FIG. 2, the plurality of gate lines (Gate1, Gate2, Gate3, Gate 4, etc.) and the plurality of signal output lines (S line1, S line2, S line3, etc.) define a plurality of detection units 14. Optionally, the signal output lines and the data lines are provided in a same layer and parallel to each other.

In the embodiment, the switch transistor is a thin film transistor T, which includes a gate electrode 15, an active layer 16, a source electrode 17 and a drain electrode 18, and the photosensitive device is on a side of the drain 18 distal to the first base substrate 11. In the embodiment, the gate lines and the gate electrode 15 are provided in a same layer, and the data lines, the signal output lines, the source electrode 17 and the drain electrode 18 are provided in a same layer.

Further, the array substrate also includes a first insulating layer 19, which is on a side of the gate electrode 15 distal to the first base substrate 11, and covers the first base substrate 11. The active layer 16 is on a side of the first insulating layer 19 distal to the gate electrode 15. A part of the source electrode 17 is on a side of the active layer 16 distal to the first insulating layer 19, and a part of the source electrode 17 is on a side of the first insulating layer 19 distal to the gate electrode 15. A part of the drain electrode 18 is on a side of the active layer 16 distal to the first insulating layer 19, and a part of the drain electrode 18 is on a side of the first insulating layer 19 distal to the gate electrode 15.

Further, the array substrate also includes a common electrode line 20, which is provided in the same layer as the source electrode 17 and the drain electrode 18. The common electrode line 20 is on a side of the first insulating layer 19 distal to the gate electrode 15.

Further, the array substrate also includes a first protection layer 21, which is on a side of the source electrode 17, the drain electrode 18 and the common electrode line 20 distal to the first insulating layer 19, and covers the first base substrate 11.

In the embodiment, the photosensitive device is a photosensitive diode D. The photosensitive diode D is a PIN junction. Specifically, the photosensitive diode D may include an N-type silicon material layer 22, an I-type silicon material layer 23, and a P-type silicon material layer 24. The N-type silicon material layer 22 is formed on a side of the drain electrode 18 distal to the first insulating layer 19, the I-type silicon material layer 23 is on a side of the N-type silicon material layer 22 distal to the drain electrode 18, and the P-type silicon material layer 24 is on a side of the I-type silicon material layer 23 distal to the N-type silicon material layer 22. A second via hole 25 is provided in the first protection layer 21. The second via hole 25 is on a side of the drain electrode 18 distal to the first insulating layer 19 and exposes a part of the drain electrode 18. The photosensitive device is in the second via hole 25 to be coupled to the drain electrode 18. Specifically, at least the N-type silicon material layer 22 in the photosensitive diode D is in the second via hole 25 so that the N-type silicon material layer 22 is coupled to the drain electrode 18.

Further, a connection pattern 26 is provided on a side of the photosensitive device distal to the drain electrode 18. Specifically, the connection pattern 26 is on a side of the P-type silicon material layer 24 distal to the I-type silicon material layer 23 to be coupled to the P-type silicon material layer 24. A part of the shielding pattern 12 is on a side of the first protection layer 21 distal to the first base substrate 11, and a part of the shielding pattern 12 is on a side of the connection pattern 26 distal to the photosensitive device.

Further, the array substrate also includes a second insulating layer 28, which is on a side of the shielding pattern 12 and the first protection layer 21 distal to the first base substrate 11, and covers the first base substrate 11. A first via hole 27 is formed in the second insulating layer 28. The first via hole 27 is on a side of the connection pattern 26 distal to the photosensitive device and exposes a part of the connection pattern 26.

The first electrode layer 13 is on a side of the second insulating layer 28 distal to the first base substrate 11 and fills in the first via hole 27 to be coupled to the exposed connection pattern 26. In addition, a third via hole 29 is provided in both the first protection layer 21 and the second insulating layer 28. The third via hole 29 is on a side of the common electrode line 20 distal to the first base substrate 11 and exposes a part of the common electrode line 20, and the first electrode layer 13 fills in the third via hole 29 to be coupled to the common electrode line 20.

Further, the array substrate also includes a second protection layer 30, which is on a side of the first electrode layer 13 distal to the second insulating layer 28, and covers the first base substrate 11.

Further, the array substrate also includes a second electrode layer 31 on a side of the second protection layer 30 distal to the first electrode layer 13.

In the embodiment, the connection pattern 26 is coupled to the common electrode line 20 through the first electrode layer 13. In this way, a common electrode signal loaded onto the common electrode line 20 may be applied to the P-type silicon material layer 24 of the photosensitive diode D through the first electrode layer 13. The first electrode layer 13 may be a common electrode layer, and the second electrode layer 31 may be a pixel electrode layer. Optionally, a material of the first electrode layer 13 includes, but is not limited to, indium tin oxide (ITO), a material of the second electrode layer 31 includes, but is not limited to, ITO, and a material of the connection pattern 26 includes, but is not limited to, ITO.

In the embodiment, the shielding pattern 12 is configured to shield irradiation light and allow detection light to be transmitted to the photosensitive device. The detection light refers to light used to implement the detection function, and the irradiation light refers to light other than the detection light. Herein, the detection function includes any surface texture detection function such as fingerprint detection function. Optionally, the shielding pattern 12 is a black matrix pattern. It could be understood that a display apparatus generally includes a black matrix for preventing leakage of backlight and color mixing from adjacent pixels, and when the shielding pattern 12 is formed to have a pattern of a black matrix (i.e., black matrix pattern), the shielding pattern 12 can also function as a black matrix, thus the black matrix can be omitted in the display apparatus of the present disclosure. Optionally, the detection light is invisible light, such as infrared light, and the irradiation light is visible light, such as white light. In practical applications, the detection light may also be light having other wavelength, which is not enumerated here.

In the embodiment, the photosensitive device includes a first area and a second area. The first area refers to an area of the photosensitive device which can convert incident light (detection light) into an electrical signal, and is referred to as active area thereinafter. The second area refers to an area of the photosensitive device which allows the detection light to pass therethrough but does not respond to the detection light (i.e., does not generate a corresponding electrical signal), and is referred to as inactive area thereinafter. The drain electrode 18 covers the active area of the photosensitive device on a side of the photosensitive device proximal to the first base substrate 11. The drain electrode 18 shields the active area of the photosensitive device, and because the detection light cannot pass through the drain electrode 18, the detection light emitted from a light incident side of the array substrate cannot be irradiated onto the active area of the photosensitive device directly.

As shown in FIG. 2, a first electrode of the photosensitive diode D is coupled to a common electrode layer. Here, the first electrode of the photosensitive diode D is the P-type silicon material layer 24, and the common electrode layer is the first electrode layer 13. A second electrode of the photosensitive diode D is coupled to a first electrode of the thin film transistor T. Here, the second electrode of the photosensitive diode D is the N-type silicon material layer 22, and the first electrode of the thin film transistor T is the drain electrode 18. A second electrode of the thin film transistor T is coupled to the signal output line (S line 1, S line2, S line3, or the like). Here, the second electrode of the thin film transistor is the source electrode 17. A control electrode (the gate electrode 15) of the thin film transistor is coupled to the gate line.

Further, the array substrate further includes a plurality of color resists sequentially arranged. For example, the plurality of color resists may include red resists, green resists and blue resists. In this case, red resists, green resists, and blue resists are sequentially arranged on the first base substrate 11.

Further, the array substrate also includes display thin film transistors required by the array substrate for implementing display function, the plurality of gate lines and the plurality of data lines define pixel units, and the display thin film transistors and the second electrode layer 31 are in the pixel units.

In the embodiment, the array substrate is a color filter on array (COA for short).

In the array substrate provided in the embodiments, the shielding pattern covers the switch transistor on a side of the switch transistor distal to the first base substrate, the photosensitive device is on a side of the shielding pattern proximal to the first base substrate, and the shielding pattern is configured to shield irradiation light and allow detection light to be transmitted to the photosensitive device. The shielding pattern provided in the embodiments can not only ensure that the detection light used to implement the detection function can be irradiated onto the photosensitive device, but also prevent the irradiation light from being irradiated onto the switch transistor by shielding the irradiation light, so as to avoid the switch transistor from reflecting the irradiation light, thereby avoiding reflective phenomenon in the display substrate. In the embodiments, both the shielding pattern and the thin film transistor are provided in the display substrate, and accurate alignment can be achieved between the shielding pattern and the source and drain electrodes of the thin film transistor, which can increase a light transmission area. In the embodiments, the first electrode layer is on a side of the switch transistor distal to the first base substrate, shields the structure in the switch transistor, and shields the influence of finger capacitance, thereby facilitating the reading of the current signal generated by the photosensitive device.

Figure 3:
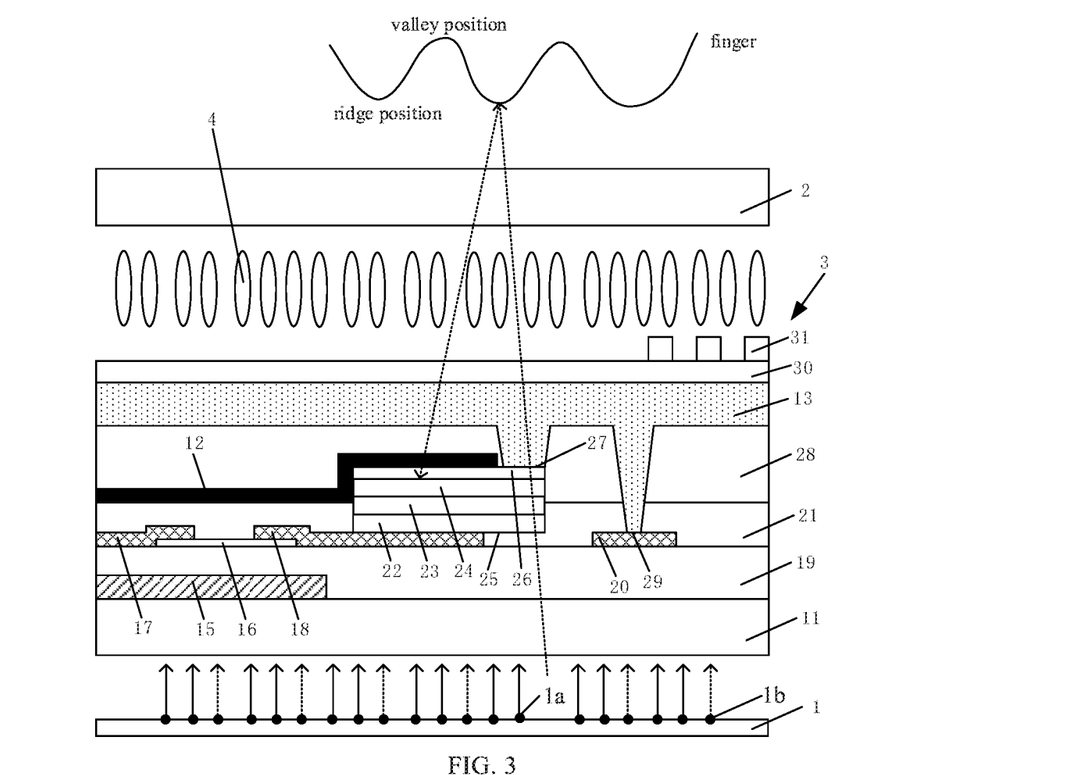
FIG. 3 is a schematic structure diagram of a display apparatus provided in an embodiment of the present disclosure.

FIG. 3 is a schematic structure diagram of a display apparatus provided in an embodiment of the present disclosure. As shown in FIG. 3, the display apparatus includes: a backlight source 1, and a counter substrate 2 and an array substrate 3 opposite to each other, and the backlight source 1 is provided on a side of the array substrate 3 distal to the counter substrate 2. The array substrate 3 may be the array substrate provided in the above embodiments, and is not repeatedly described here.

A liquid crystal layer 4 is further provided between the counter substrate 2 and the array substrate 3.

In the embodiment, the array substrate 3 may be a COA, and the counter substrate 2 may be a glass substrate or a quartz substrate.

In the embodiment, the backlight source 1 may include irradiation light sources 1a and detection light sources 1b provided alternately, the irradiation light sources 1a are configured to emit the irradiation light, and the detection light sources 1b are configured to emit the detection light. As shown in FIG. 3, solid arrows represent the irradiation light, and dashed arrows represent the detection light. Optionally, the irradiation light sources are white LEDs, and the irradiation light may be white light; the detection light sources are infrared LEDs, and the detection light may be infrared light. In practical applications, the detection light may also be light having other wavelength, which is not enumerated here.

FIG. 3 illustrates an example of fingerprint detection. As shown in FIGS. 2 and 3, a finger includes valley positions and ridge positions. When the finger performs a touch operation, the detection light emitted from the backlight source 1 passes through the inactive area of the photosensitive diode in the array substrate 3 and is irradiated onto the finger, and the finger reflects the detection light back to array substrate 3. When the detection light is irradiated onto the shielding pattern 12, the shielding pattern 12 allows the detection light reflected back to the array substrate 3 to be transmitted to the photosensitive diode D. The photosensitive diode D converts the detection light into a current signal, and outputs the current signal to the signal output line through a turned-on thin film transistor T. The signal output line outputs the current signal, and the current signal can be used to determine whether the detected fingerprint position is a valley position or a ridge position. There is a difference between a valley position and a ridge position of the finger, so light intensity of the detection light reflected by the valley position is different from light intensity of the detection light reflected by the ridge position. The photosensitive diode D generates different current signals when the detection light having different light intensities is irradiated onto the photosensitive diode D. Thus, whether the detected fingerprint position is a valley position or a ridge position can be determined by using the current signal.

In the embodiment, the photosensitive device includes an active area and an inactive area, and the drain electrode 18 covers the active area of the photosensitive device on a side of the photosensitive device proximal to the first base substrate 11. The drain electrode 18 shields the active area of the photosensitive device, and because the detection light cannot pass through the drain electrode 18, the detection light emitted from a light incident side of the array substrate 3 cannot be irradiated onto the active area of the photosensitive device directly.

In the embodiment, the detection light is invisible light. The detection light reflected back by the finger will be reflected by the drain electrode 18 when being irradiated onto the drain electrode 18. However, because the detection light is invisible light, and the detection light reflected by the drain electrode 18 is invisible to human eyes, the detection light reflected by the drain electrode 18 will not result in reflective phenomenon.

In the display apparatus provided in the embodiments, the shielding pattern covers the switch transistor on a side of the switch transistor distal to the first base substrate, the photosensitive device is on a side of the shielding pattern proximal to the first base substrate, and the shielding pattern is configured to shield irradiation light and allow detection light to be transmitted to the photosensitive device. The backlight source in the embodiments includes the irradiation light sources configured to emit the irradiation light and the detection light sources configured to emit the detection light, and the shielding pattern provided in the embodiments can not only ensure that the detection light can be irradiated onto the photosensitive device, but also prevent the irradiation light from being irradiated onto the switch transistor by shielding the irradiation light, so as to avoid the switch transistor from reflecting the irradiation light, thereby avoiding reflective phenomenon in the display apparatus. In the embodiments, both the shielding pattern and the thin film transistor are provided in the display substrate, and accurate alignment can be achieved between the shielding pattern and the source and drain electrodes of the thin film transistor, which can increase a light transmission area. In the embodiments, the first electrode layer is on a side of the switch transistor distal to the first base substrate, shields the structure in the switch transistor, and shields the influence of finger capacitance, thereby facilitating the reading of the current signal generated by the photosensitive device.

Figure 4:
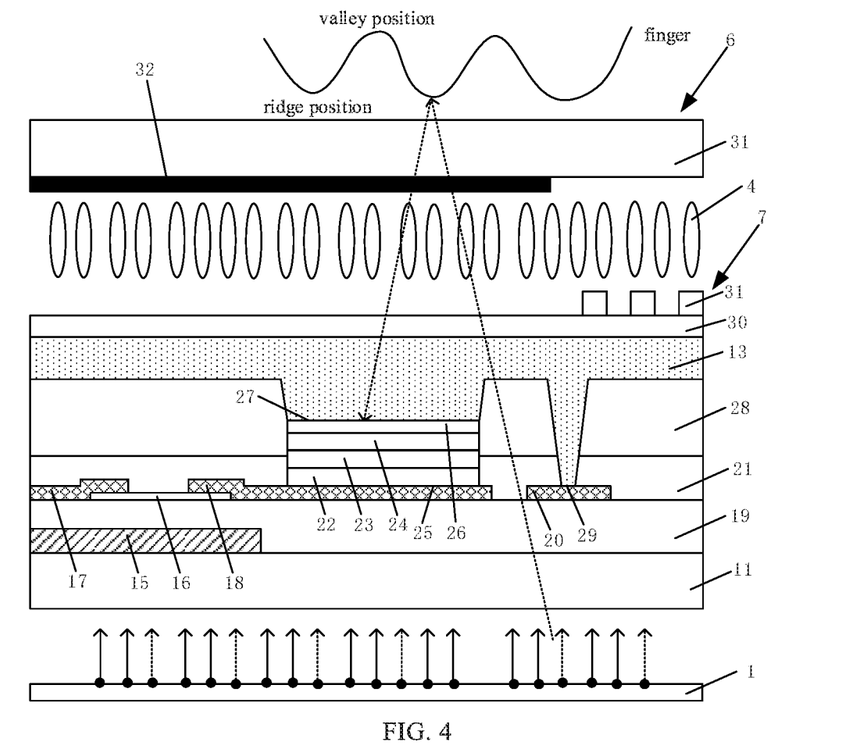
FIG. 4 is a schematic structure diagram of a display apparatus provided in an embodiment of the present disclosure.

FIG. 4 is a schematic structure diagram of a display apparatus provided in an embodiment of the present disclosure. As shown in FIGS. 4 and 2, the display apparatus includes a backlight source 1, and a counter substrate 6 and an array substrate 7 opposite to each other. The backlight source 1 is on a side of the array substrate 7 distal to the counter substrate 6. The array substrate 7 includes a first base substrate 11, and a first electrode layer 13 and a plurality of detection units 14 on the first base substrate 11. Each of the plurality of detection units 14 includes a switch transistor and a photosensitive device coupled to the switch transistor, and the photosensitive device is also coupled to the first electrode layer 13. The backlight source 1 is configured to emit irradiation light and detection light. The counter substrate 6 includes a second base substrate 31 and a shielding pattern 32 provided on a side of the second base substrate 31 proximal to the array substrate 7. The shielding pattern 32 covers the switch transistor (i.e., a projection of the switch transistor on the first base substrate 11 is within a projection of the shielding pattern 32 on the first base substrate 11), and is configured to shield irradiation light and allow detection light to be transmitted to the photosensitive device.

The display apparatus in the present embodiment differs from the above display apparatus described with reference to FIG. 3 in that: the shielding pattern 32 in the present embodiment is in the counter substrate 6; in the present embodiment, the drain electrode 18 may cover the photosensitive device on a side of the photosensitive device proximal to the first base substrate 11, or the drain electrode 18 may cover the active area of the photosensitive device on a side of the photosensitive device proximal to the first base substrate 11 (see FIG. 3); in the present embodiment, the detection light can pass through an area in which no structures capable of shielding the detection light, such as the thin film transistor, the common electrode line, and the like are provided, to reach a surface to be detected (e.g., finger surface). For the remaining structures of the array substrate in the present embodiment, one may refer to the above description in conjunction with FIG. 1, which will not be repeatedly described here.

In the embodiment, the shielding pattern 32 in the counter substrate 6 is configured to cover the switch transistor and the photosensitive device, that is, projections of the switch transistor and the photosensitive device on the first base substrate 11 are within the projection of the shielding pattern 32 on the first base substrate 11. Because the detection light can pass through the shielding pattern 32, the detection light reflected back by the finger can pass through the shielding pattern 32 to reach the photosensitive device.

In the embodiment, a liquid crystal layer 4 is further provided between the counter substrate 6 and the array substrate 7.

In the embodiment, the array substrate 7 may be an array substrate, and the counter substrate 6 may be a color filter substrate.

In the embodiment, the backlight source 1 may include irradiation light sources 1a and detection light sources 1b provided alternately, the irradiation light sources 1a are configured to emit the irradiation light, and the detection light sources 1b are configured to emit the detection light. As shown in FIG. 4, solid arrows represent the irradiation light, and dashed arrows represent the detection light. Optionally, the irradiation light sources are white LEDs, and the irradiation light may be white light; the detection light sources are infrared LEDs, and the detection light may be infrared light. In practical applications, the detection light may also be light having other wavelength, which is not enumerated here.

Optionally, the shielding pattern 32 is a black matrix pattern.

FIG. 4 illustrates an example of fingerprint detection. As shown in FIGS. 2 and 4, a finger includes valley positions and ridge positions. When the finger performs a touch operation, the detection light emitted from the backlight source 1 passes through an area of the array substrate 7 between the thin film transistor and the common electrode line 20 and the shielding pattern 12, and is irradiated onto the finger, the finger reflects the detection light, the reflected detection light passes through the shielding pattern 12 and returns back to the photosensitive diode D in the array substrate 7, and the photosensitive diode D converts the detection light into a current signal, and outputs the current signal to the signal output line through a turned-on thin film transistor T. The signal output line outputs the current signal, and the current signal can be used to determine whether the detected fingerprint position is a valley position or a ridge position. There is a difference between a valley position and a ridge position of the finger, so light intensity of the detection light reflected by the valley position is different from light intensity of the detection light reflected by the ridge position. The photosensitive diode D generates different current signals when the detection light having different light intensities is irradiated onto the photosensitive diode D. Thus, whether the detected fingerprint position is a valley position or a ridge position can be determined by using the current signal.

In the embodiment, the drain electrode 18 covers the photosensitive device on a side of the photosensitive device proximal to the first base substrate 11. The drain electrode 18 shields the photosensitive device, and because the detection light cannot pass through the drain electrode 18, the detection light emitted from a light incident side of the array substrate 7 cannot be irradiated onto the photosensitive device directly.

In the display apparatus provided in the embodiments, the shielding pattern covers the switch transistor and the photosensitive device, and the shielding pattern is configured to shield irradiation light and allow detection light to be transmitted to the photosensitive device. The backlight source in the embodiments includes the irradiation light sources configured to emit the irradiation light and the detection light sources configured to emit the detection light, and the shielding pattern provided in the embodiments can not only ensure that the detection light can be irradiated onto the photosensitive device, but also prevent the irradiation light from being irradiated onto the switch transistor by shielding the irradiation light, so as to avoid the switch transistor from reflecting the irradiation light, thereby avoiding reflective phenomenon in the display apparatus. In the embodiments, the first electrode layer is on a side of the switch transistor distal to the first base substrate, shields the structure in the switch transistor, and shields the influence of finger capacitance, thereby facilitating the reading of the current signal generated by the photosensitive device.

Embodiments of the present disclosure provide a method for fabricating a display substrate, including: forming a shielding pattern and a plurality of detection units on a first base substrate, wherein each of the plurality of detection units is formed to include a switch transistor and a photosensitive device coupled to the switch transistor, the shielding pattern is formed to cover the switch transistor on a side of the switch transistor distal to the first base substrate 11, the photosensitive device is formed on a side of the shielding pattern proximal to the first base substrate 11, and the shielding pattern is formed to shield irradiation light and allow detection light to be transmitted to the photosensitive device.

Figure 5:
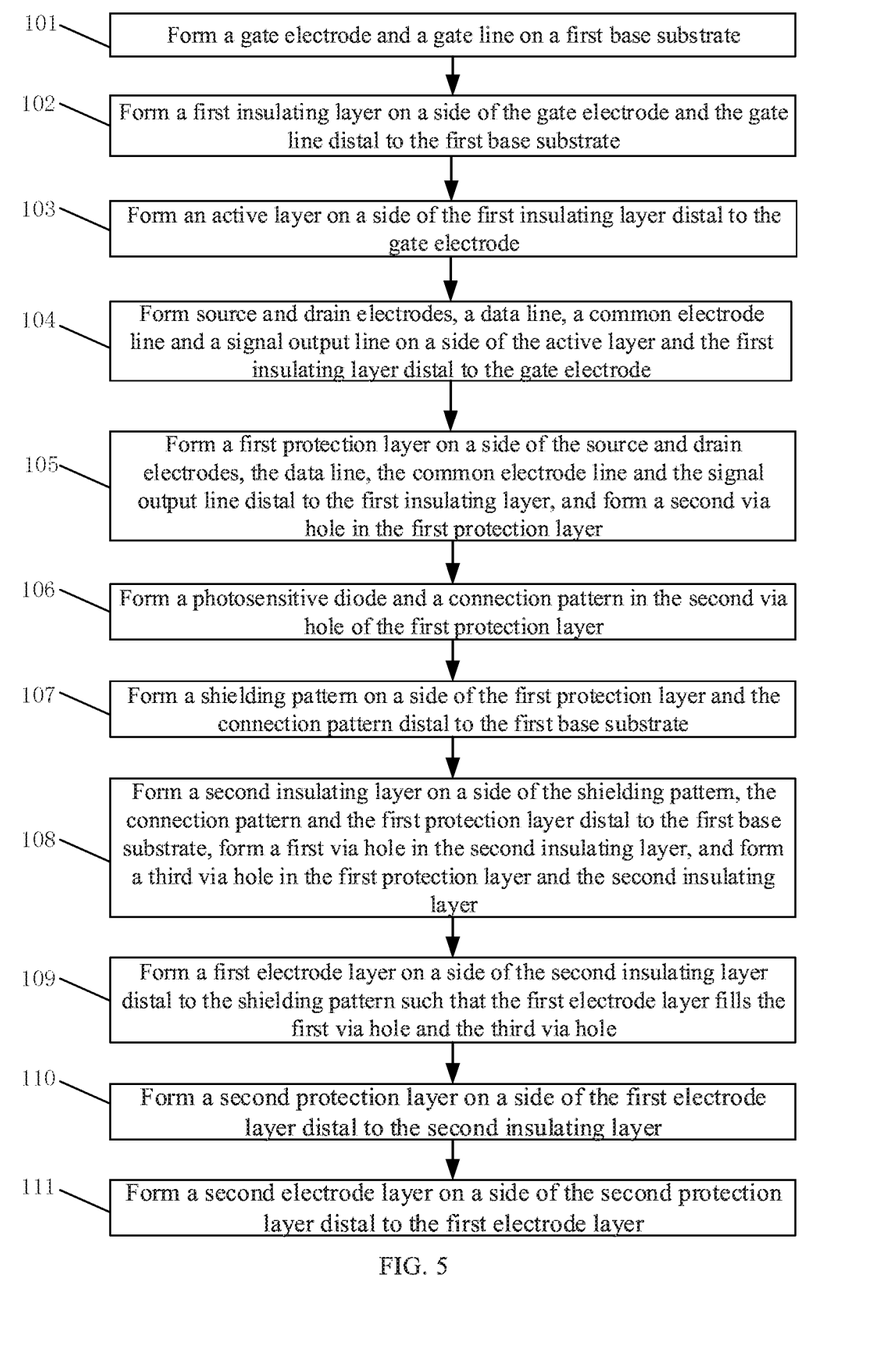
FIG. 5 is a flowchart of a method for fabricating an array substrate provided in an embodiment of the present disclosure.

The method for fabricating a array substrate in the embodiments will be described in detail below with reference to FIG. 5. FIG. 5 is a flowchart of a method for fabricating a array substrate provided in an embodiment of the present disclosure. As shown in FIG. 5, the method includes steps 101 to 111.

At step 101, a gate electrode and a gate line are formed on the first base substrate.

Figure 6A:
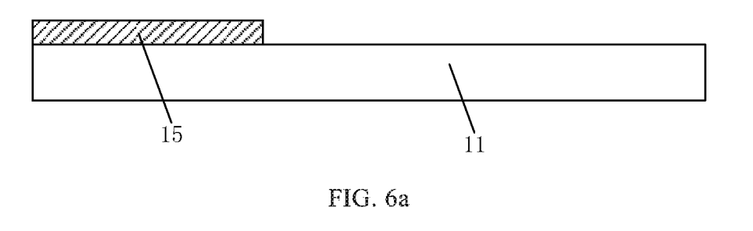
FIG. 6a is a schematic diagram of forming a gate electrode in an embodiment of the present disclosure.

FIG. 6a is a schematic diagram of forming a gate electrode and a gate line in the embodiment. As shown in FIG. 6a, the gate electrode 15 and the gate line (not shown) are formed on the first base substrate 11 by a patterning process.

At step 102, a first insulating layer is formed on a side of the gate electrode and the gate line distal to the first base substrate.

Figure 6B:
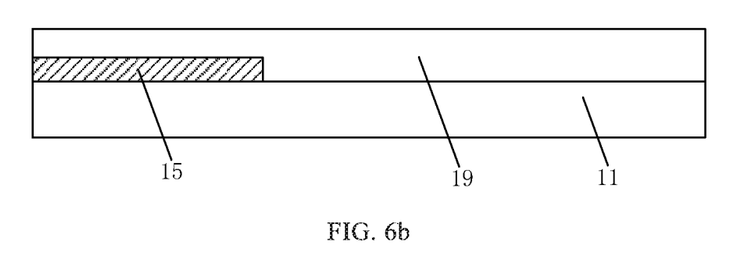
FIG. 6b is a schematic diagram of forming a first insulating layer in an embodiment of the present disclosure.

FIG. 6b is a schematic diagram of forming a first insulating layer in the embodiment. As shown in FIG. 6b, the first insulating layer 19 is formed on a side of the gate electrode 15 and the gate line distal to the first base substrate 11, and the first insulating layer 19 covers the first base substrate 11.

At step 103, an active layer is formed on a side of the first insulating layer distal to the gate electrode.

Figure 6C:
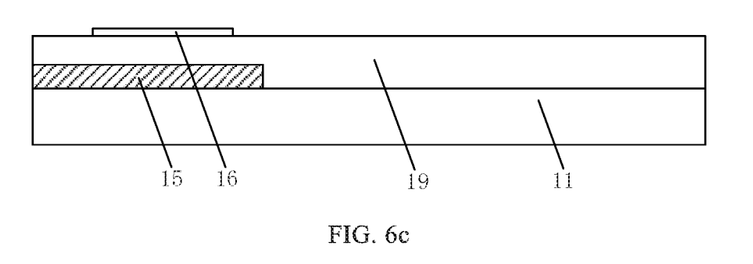
FIG. 6c is a schematic diagram of forming an active layer in an embodiment of the present disclosure.

FIG. 6c is a schematic diagram of forming an active layer in the embodiment. As shown in FIG. 6c, the active layer 16 is formed on a side of the first insulating layer 19 distal to the gate electrode 15 by a patterning process.

At step 104, a source electrode, a drain electrode, a data line and a common electrode line and a signal output line are formed on a side of the active layer and the first insulating layer distal to the gate electrode.

Figure 6D:
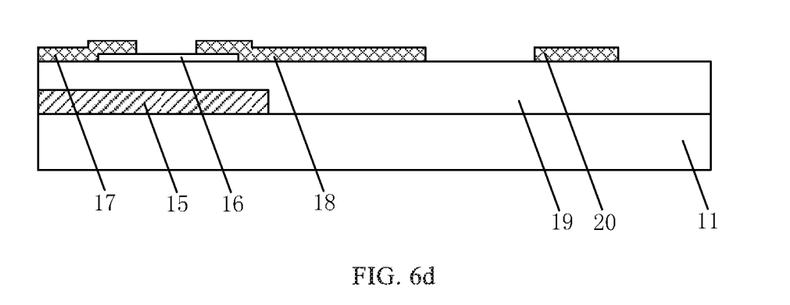
FIG. 6d is a schematic diagram of forming a source-drain electrode layer in an embodiment of the present disclosure.

FIG. 6d is a schematic diagram of forming a source-drain electrode layer in the embodiment. As shown in FIG. 6d, the source electrode 17, the drain electrode 18, the data line (not shown), the common electrode line 20, and the signal output line (not shown) are formed on a side of the active layer 16 and the first insulating layer 19 distal to the gate electrode 15 by a patterning process.

At step 105, a first protection layer is formed on a side of the source electrode, the drain electrode, the data line, the common electrode line and the signal output line distal to the first insulating layer, and a second via hole exposing a part of the drain electrode is formed in the first protection layer.

Figure 6E:
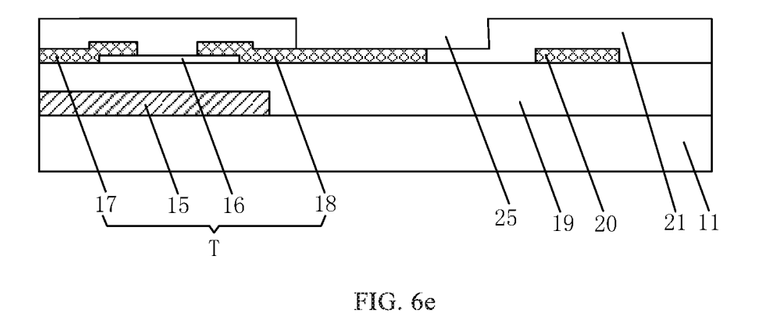
FIG. 6e is a schematic diagram of forming a first protection layer in an embodiment of the present disclosure.

FIG. 6e is a schematic diagram of forming a first protection layer in the embodiment. As shown in FIG. 6e, the first protection layer 21 is deposited on a side of the source electrode 17, the drain electrode 18, the data line, the common electrode line 20 and the signal output line distal to the first insulating layer 19, and the second via hole 25 is formed in the first protection layer 21 by a patterning process.

At step 106, a photosensitive diode and a connection pattern are formed in the second via hole of the first protection layer.

Figure 6F:
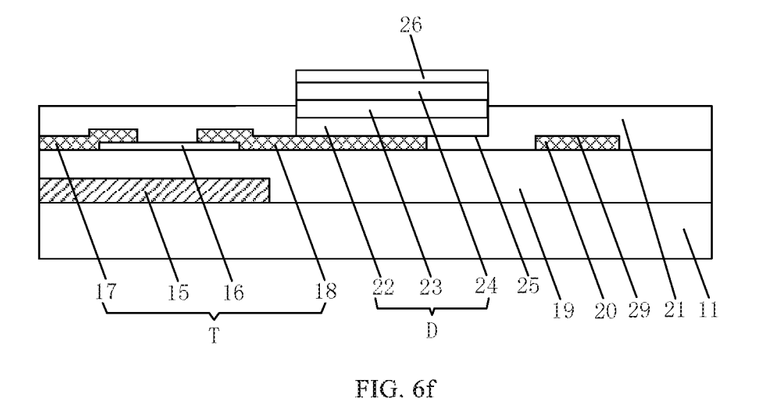
FIG. 6f is a schematic diagram of forming a photosensitive diode in an embodiment of the present disclosure.

FIG. 6f is a schematic diagram of forming a photosensitive diode in the embodiment. As shown in FIG. 6f, the photosensitive diode D is formed in the second via hole 25 of the first protection layer 21 by a patterning process, and the connection pattern 26 is formed on a side of the photosensitive diode D distal to the drain electrode 18 by a patterning process. The photosensitive diode D includes an N-type silicon material layer 22, an I-type silicon material layer 23, and a P-type silicon material layer 24. The N-type silicon material layer 22 is formed on a side of the drain electrode 18 distal to the first insulating layer 19, the I-type silicon material layer 23 is formed on a side of the N-type silicon material layer 22 distal to the drain electrode 18, the P-type silicon material layer 24 is formed on a side of the I-type silicon material layer 23 distal to the N-type silicon material layer 22, and the connection pattern 26 is formed on a side of the P-type silicon material layer 24 distal to the I-type silicon material layer 23.

At step 107, a shielding pattern is formed on a side of the first protection layer and the connection pattern distal to the first base substrate.

Figure 6G:
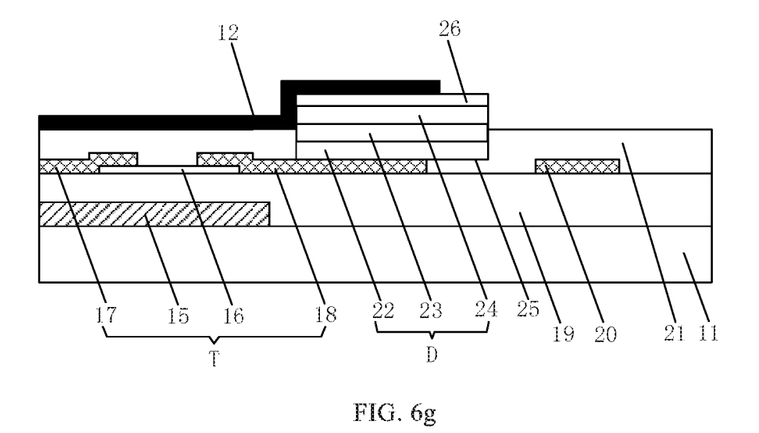
FIG. 6g is a schematic diagram of forming a shielding pattern in an embodiment of the present disclosure.

FIG. 6g is a schematic diagram of forming a shielding pattern in the embodiment. As shown in FIG. 6g, the shielding pattern 12 is formed on a side of the first protection layer 21 and the connection pattern 26 distal to the first base substrate 11 by a patterning process. The shielding pattern 12 covers the thin film transistor T, and the photosensitive diode D is on a side of the shielding pattern 12 proximal to the first base substrate 11. In the embodiment, the shielding pattern is a black matrix pattern.

At step 108, a second insulating layer is formed on a side of the shielding pattern, the connection pattern and the first protection layer distal to the first base substrate, a first via hole is formed in the second insulating layer, and a third via hole is formed in the first protection layer and the second insulating layer, the first via hole exposing a part of the connection pattern, and the third via hole exposing a part of the common electrode line.

Figure 6H:
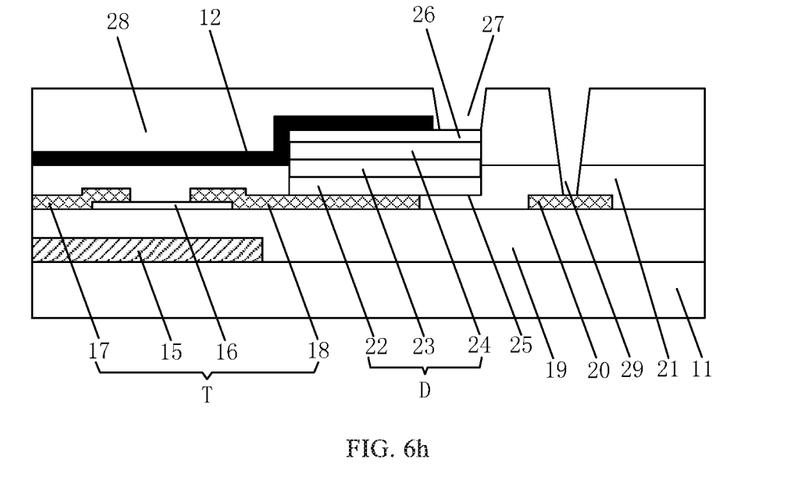
FIG. 6h is a schematic diagram of forming a second insulating layer in an embodiment of the present disclosure.

FIG. 6h is a schematic diagram of forming a second insulating layer in the embodiment. As shown in FIG. 6h, the second insulating layer 28 is deposited on a side of the shielding pattern 12, the connection pattern 26 and the first protection layer 21 distal to the first base substrate 11, the first via hole 27 is formed in the second insulating layer 28 by a patterning process, and the third via hole 29 is formed in the first protection layer 21 and the second insulating layer 28 by a patterning process, the first via hole 27 exposing a part of the connection pattern 26, and the third via hole 29 exposing a part of the common electrode line 20.

At step 109, a first electrode layer is formed on a side of the second insulating layer distal to the shielding pattern, the first electrode layer filling the first via hole and the third via hole.

Figure 6I:
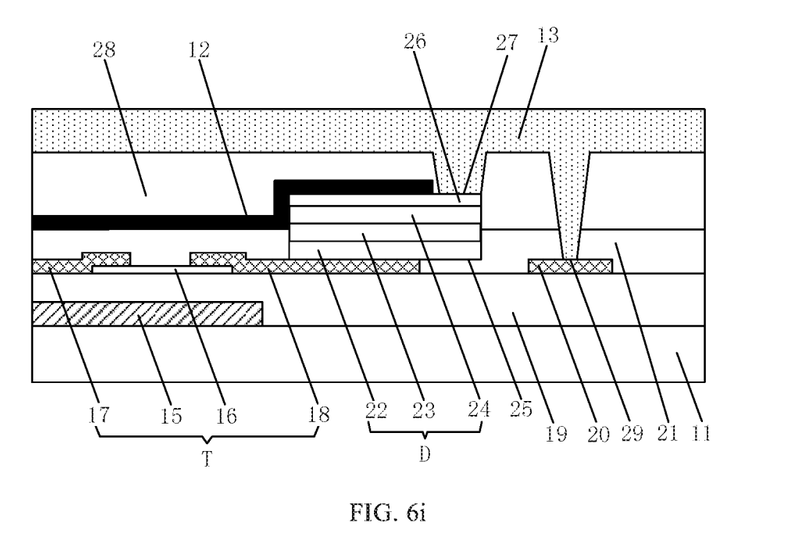
FIG. 6i is a schematic diagram of forming a first electrode layer in an embodiment of the present disclosure.

FIG. 6i is a schematic diagram of forming a first electrode layer in the embodiment. As shown in FIG. 6i, the first electrode layer 13 is formed on a side of the second insulating layer 28 distal to the shielding pattern 12, the first electrode layer 13 fills the first via hole 27 to be coupled to the connection pattern 26, and fills the third via hole 29 to be coupled to the common electrode line 20.

At step 110, a second protection layer is formed on a side of the first electrode layer distal to the second insulating layer.

Figure 6J:
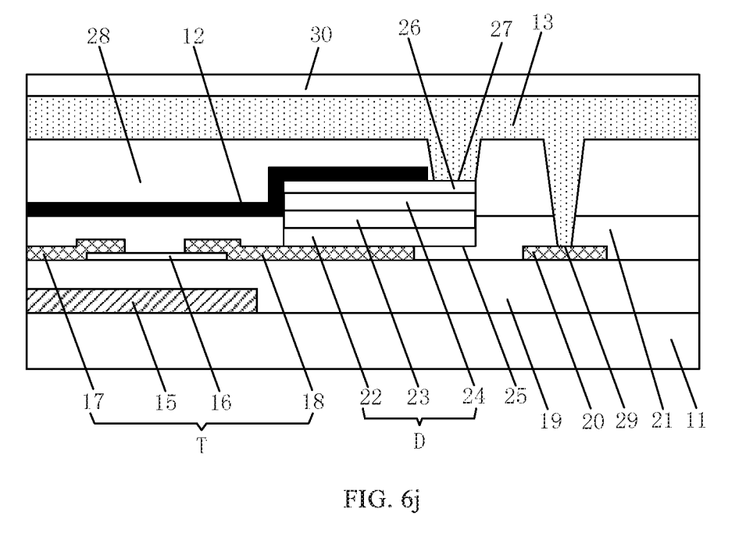
FIG. 6j is a schematic diagram of forming a second protection layer in an embodiment of the present disclosure.

FIG. 6j is a schematic diagram of forming a second protection layer in the embodiment. As shown in FIG. 6j, the second protection layer 30 is deposited on a side of the first electrode layer 13 distal to the second insulating layer 28 to cover the first base substrate 11.

At step 111, a second electrode layer is formed on a side of the second protection layer distal to the first electrode layer.

As shown in FIG. 1, the second electrode layer 31 is formed on a side of the second protection layer 30 distal to the first electrode layer 13 by a patterning process.

Optionally, between step 107 and step 108, the method further includes: forming, on the first base substrate subjected to step 107, a plurality of color resists sequentially arranged. For example, the color resists may include red resists, green resists and blue resists.

The method for fabricating an array substrate provided in the embodiments may be used to fabricate the above array substrate described with reference to FIG. 1.

In the method for fabricating an array substrate provided in the embodiments, the shielding pattern covers the switch transistor on a side of the switch transistor distal to the first base substrate, the photosensitive device is on a side of the shielding pattern proximal to the first base substrate, and the shielding pattern is configured to shield irradiation light and allow detection light to be transmitted to the photosensitive device. The shielding pattern provided in the embodiments can not only ensure that the detection light can be irradiated onto the photosensitive device, but also prevent the irradiation light from being irradiated onto the switch transistor by shielding the irradiation light, so as to avoid the switch transistor from reflecting the irradiation light, thereby avoiding reflective phenomenon in the display apparatus. In the embodiments, both the shielding pattern and the thin film transistor are provided in the display substrate, and accurate alignment can be achieved between the shielding pattern and the source and drain electrodes of the thin film transistor, which can increase a light transmission area. In the embodiments, the first electrode layer is on a side of the switch transistor distal to the first base substrate, shields the structure in the switch transistor, and shields the influence of finger capacitance, thereby facilitating the reading of the current signal generated by the photosensitive device.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

The invention claimed is:

1. An array substrate, comprising: a base substrate, and a shielding pattern and a plurality of detection units on the base substrate, wherein at least one of the plurality of detection units comprises a switch transistor and a photosensitive device coupled to the switch transistor, the shielding pattern covers the switch transistor on a side of the switch transistor distal to the base substrate, the photosensitive device is on a side of the shielding pattern proximal to the base substrate, and the shielding pattern is configured to shield irradiation light and allow detection light to be transmitted to the photosensitive device,
wherein the switch transistor is a thin film transistor having a drain electrode coupled to the photosensitive device, the photosensitive device comprises a first area and a second area, the drain electrode covers the first area of the photosensitive device on a side of the photosensitive device proximal to the base substrate, and the second area of the photosensitive device is configured to allow the detection light to pass therethrough.

2. The array substrate of claim 1, wherein the shielding pattern is configured to allow invisible light to be transmitted to the photosensitive device.

3. The array substrate of claim 2, wherein the shielding pattern is configured to allow infrared light to be transmitted to the photosensitive device.

4. The array substrate of claim 1, further comprising a first electrode layer provided on a side of the switch transistor and the photosensitive device distal to the base substrate and coupled to photosensitive device.

5. The array substrate of claim 1, wherein the photosensitive device is a photosensitive diode.

6. The array substrate of claim 5, wherein a connection pattern is provided on a side of the photosensitive device distal to the base substrate, and the connection pattern is located on a side of the shielding pattern proximal to the base substrate and coupled to the first electrode layer.

7. The array substrate of claim 6, wherein the photosensitive diode has a first electrode coupled to the drain electrode of the thin film transistor, and a second electrode coupled to the connection pattern.

8. The array substrate of claim 7, wherein the first electrode layer is a common electrode layer coupled to a common electrode line.

9. The array substrate of claim 1, wherein the shielding pattern is a black matrix pattern.

10. The array substrate of claim 1, wherein a plurality of gate lines and a plurality of signal output lines are formed on the base substrate and define the plurality of detection units, and each of the plurality of detection units has a same structure.

11. The array substrate of claim 1, wherein the irradiation light is visible light.

12. A display apparatus, comprising a backlight source and the array substrate of claim 1, wherein the backlight source is on a base substrate side of the array substrate and configured to emit the irradiation light and the detection light.

13. The display apparatus of claim 12, wherein the backlight source comprises irradiation light sources and detection light sources provided alternately, the irradiation light sources are configured to emit the irradiation light, and the detection light sources are configured to emit the detection light.

14. A display apparatus, comprising a backlight source, and a counter substrate and an array substrate opposite to each other, wherein the backlight source is on a side of the array substrate distal to the counter substrate and configured to emit irradiation light and detection light; the array substrate comprises a first base substrate and a plurality of detection units on the first base substrate, each of the plurality of detection units comprises a switch transistor and a photosensitive device coupled to the switch transistor; the counter substrate comprises a second base substrate and a shielding pattern provided on a side of the second base substrate proximal to the display substrate, and the shielding pattern completely covers the switch transistor and is configured to shield the irradiation light and allow the detection light to be transmitted to the photosensitive device.

15. The display apparatus of claim 14, wherein the backlight source comprises irradiation light sources and detection light sources provided alternately, the irradiation light sources are configured to emit the irradiation light, and the detection light sources are configured to emit the detection light.

16. The display apparatus of claim 15, wherein the detection light is invisible light.

17. The display apparatus of claim 14, wherein the switch transistor is a thin film transistor having a drain electrode covering the photosensitive device on a side of the photosensitive device proximal to the first base substrate to be coupled to the photosensitive device.

18. A method for fabricating an array substrate, the array substrate being the array substrate of claim 1, the method comprising: forming the shielding pattern and the plurality of detection units on the base substrate, wherein each of the plurality of detection units is formed to comprise the switch transistor and the photosensitive device coupled to the switch transistor, the shielding pattern is formed to cover the switch transistor on the side of the switch transistor distal to the base substrate, the photosensitive device is formed on the side of the shielding pattern proximal to the base substrate, and the shielding pattern is formed to shield irradiation light and allow detection light to be transmitted to the photosensitive device.

* * * * *

UNITED STATES PATENT AND TRADEMARK OFFICE
CERTIFICATE OF CORRECTION

| | |
|---|---|
| PATENT NO. | : 10,585,304 B2 |
| APPLICATION NO. | : 15/936830 |
| DATED | : March 10, 2020 |
| INVENTOR(S) | : Xiaoliang Ding et al. |

Page 1 of 1

It is certified that error appears in the above-identified patent and that said Letters Patent is hereby corrected as shown below:

On the Title Page

Item (63), please change from "Continuation of" to "Continuation-in part of"

Signed and Sealed this
Sixteenth Day of June, 2020

Andrei Iancu
*Director of the United States Patent and Trademark Office*